US011017987B2

(12) United States Patent
Fukasawa

(10) Patent No.: US 11,017,987 B2
(45) Date of Patent: May 25, 2021

(54) ETCHING METHOD AND ETCHING PROCESSING APPARATUS

(71) Applicant: SONY SEMICONDUCTOR SOLUTIONS CORPORATION, Kanagawa (JP)

(72) Inventor: Masanaga Fukasawa, Tokyo (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/637,437

(22) PCT Filed: Jul. 3, 2018

(86) PCT No.: PCT/JP2018/025193
§ 371 (c)(1),
(2) Date: Feb. 7, 2020

(87) PCT Pub. No.: WO2019/035283
PCT Pub. Date: Feb. 21, 2019

(65) Prior Publication Data
US 2020/0373135 A1 Nov. 26, 2020

(30) Foreign Application Priority Data

Aug. 18, 2017 (JP) .............................. JP2017-157758

(51) Int. Cl.
*H01J 37/32* (2006.01)
*H01L 21/311* (2006.01)

(52) U.S. Cl.
CPC .... *H01J 37/32926* (2013.01); *H01J 37/3299* (2013.01); *H01J 37/32954* (2013.01); *H01J 37/32972* (2013.01); *H01L 21/31116* (2013.01)

(58) Field of Classification Search
CPC .......... H01J 37/32926; H01J 37/32954; H01J 37/3299; H01J 37/32972; H01L 21/31116;
(Continued)

(56) References Cited

U.S. PATENT DOCUMENTS 6,153,852 A * 11/2000 Blutke .................... F23G 5/085
110/346
2002/0160125 A1 10/2002 Johnson et al.
(Continued)

FOREIGN PATENT DOCUMENTS

CN      1369021 A      9/2002
CN    101853780 A    10/2010
(Continued)

OTHER PUBLICATIONS

International Search Report and Written Opinion of PCT Application No. PCT/JP2018/025193, dated Sep. 4, 2018, 09 pages of ISRWO.

*Primary Examiner* — Lan Vinh
(74) *Attorney, Agent, or Firm* — Chip Law Group

(57) ABSTRACT

An etching method includes inputting, to a setting unit, at least electric power, a pressure, and a gas flow rate, performing etching processing in a chamber, on the basis of a value inputted to the setting unit, and calculating an ion energy distribution mathematical function, by using a measured value upon the etching processing.

12 Claims, 9 Drawing Sheets

(58) Field of Classification Search
CPC . H01L 21/31138; H01L 21/3065; H05H 1/00; H05H 1/46
USPC .......... 438/9, 700, 710, 712, 714, 719, 720; 156/345.18, 345.24, 345.27, 345.28
See application file for complete search history.

(56) References Cited

U.S. PATENT DOCUMENTS

| | | |
|---|---|---|
| 2006/0214593 A1 | 9/2006 | Denpoh |
| 2010/0243431 A1 | 9/2010 | Kuboi et al. |
| 2015/0162223 A1* | 6/2015 | Ui .......................... H01L 22/26 438/10 |
| 2016/0020072 A1* | 1/2016 | Brouk .................. H01J 37/241 156/345.28 |
| 2017/0064806 A1 | 3/2017 | Aoi et al. |
| 2017/0229311 A1* | 8/2017 | Tan .................. H01J 37/32715 |
| 2018/0019100 A1* | 1/2018 | Brouk .............. H01J 37/32935 |

FOREIGN PATENT DOCUMENTS

| | | |
|---|---|---|
| JP | 07-297173 A | 11/1995 |
| JP | 10-074481 A | 3/1998 |
| JP | 2002-527887 A | 8/2002 |
| JP | 2003-507880 A | 2/2003 |
| JP | 2006-269268 A | 10/2006 |
| JP | 2010-232594 A | 10/2010 |
| JP | 2015-213020 A | 11/2015 |
| KR | 10-0750420 B1 | 8/2007 |
| TW | I267562 B | 12/2006 |
| WO | 2001/012873 A1 | 2/2001 |
| WO | 2015/166787 A1 | 11/2015 |

\* cited by examiner

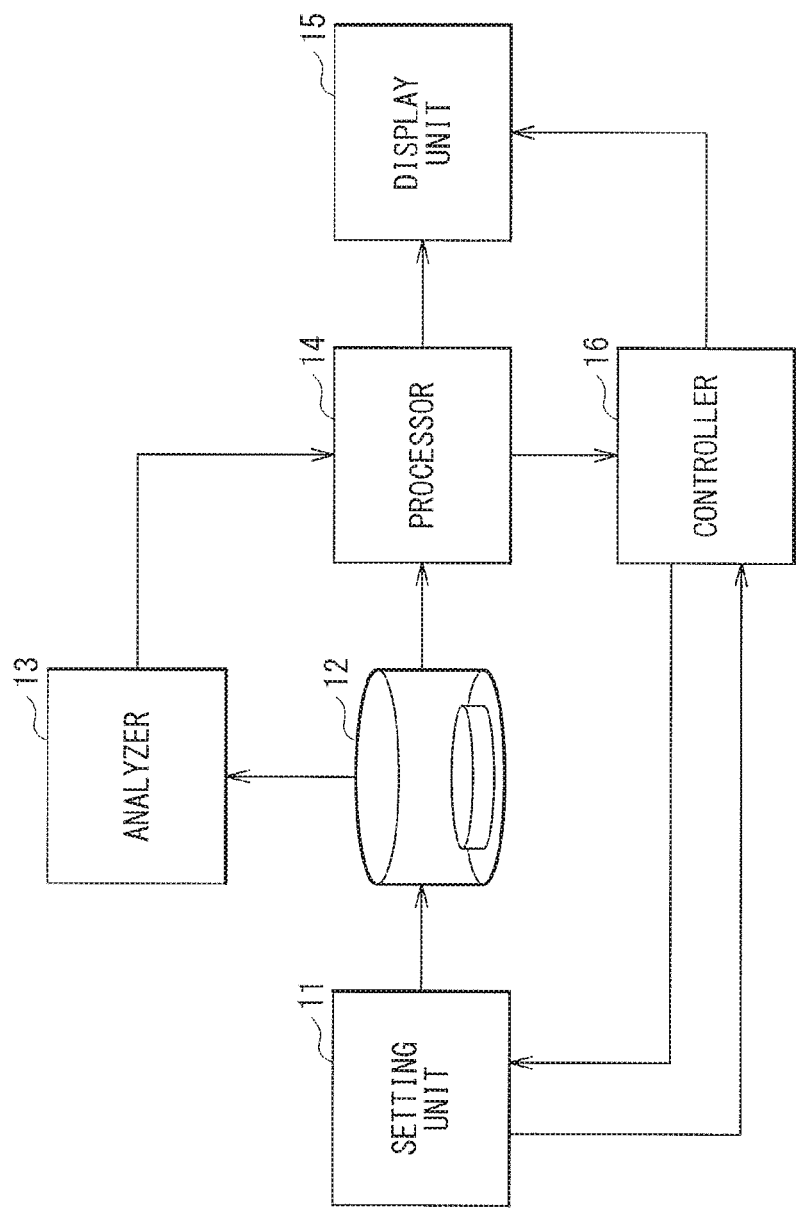
[FIG. 1]

[FIG. 2]
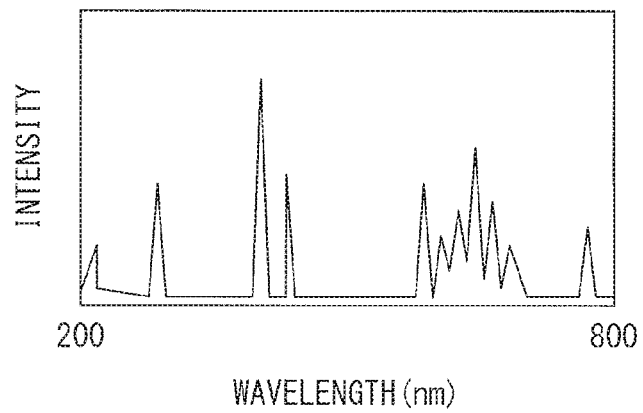
[FIG. 3A]
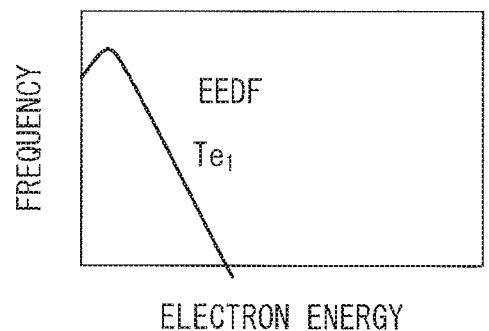
[FIG. 3B]
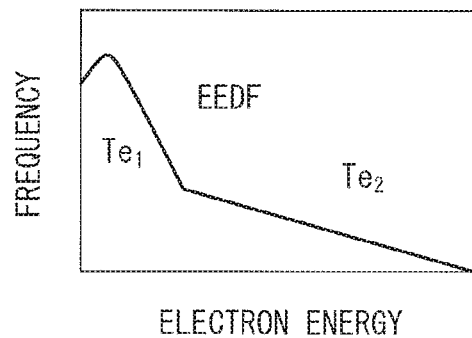

[FIG. 4]
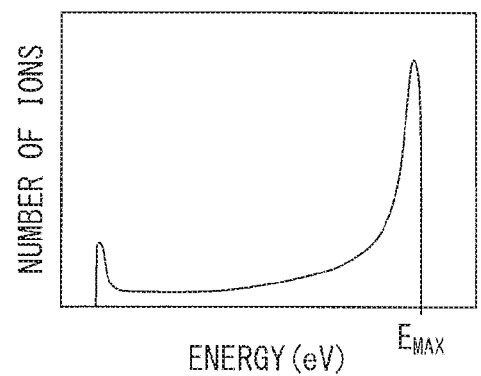
[FIG. 5A]
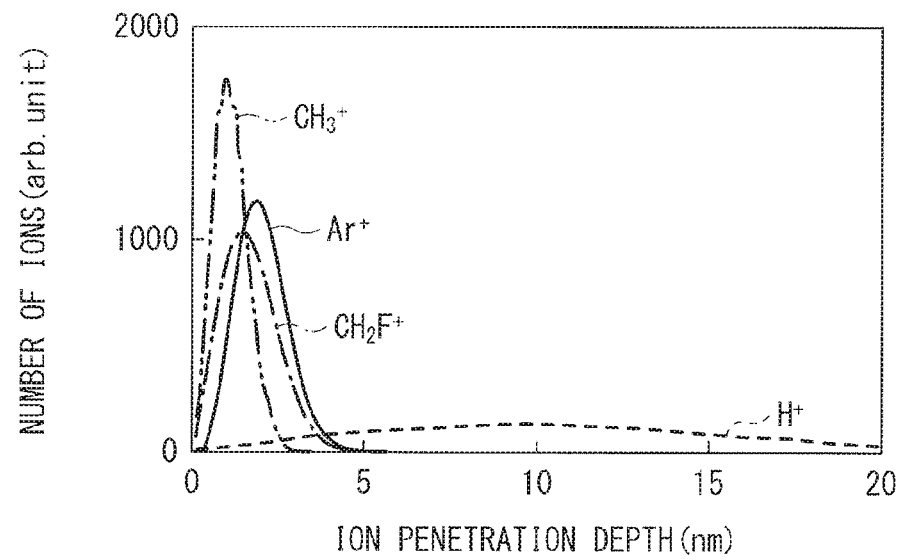

[FIG. 5B]
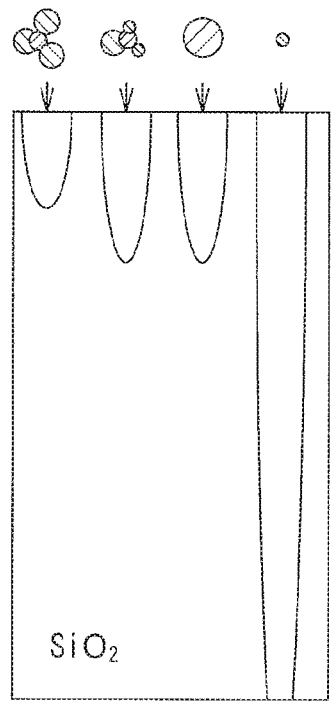

[FIG. 6]
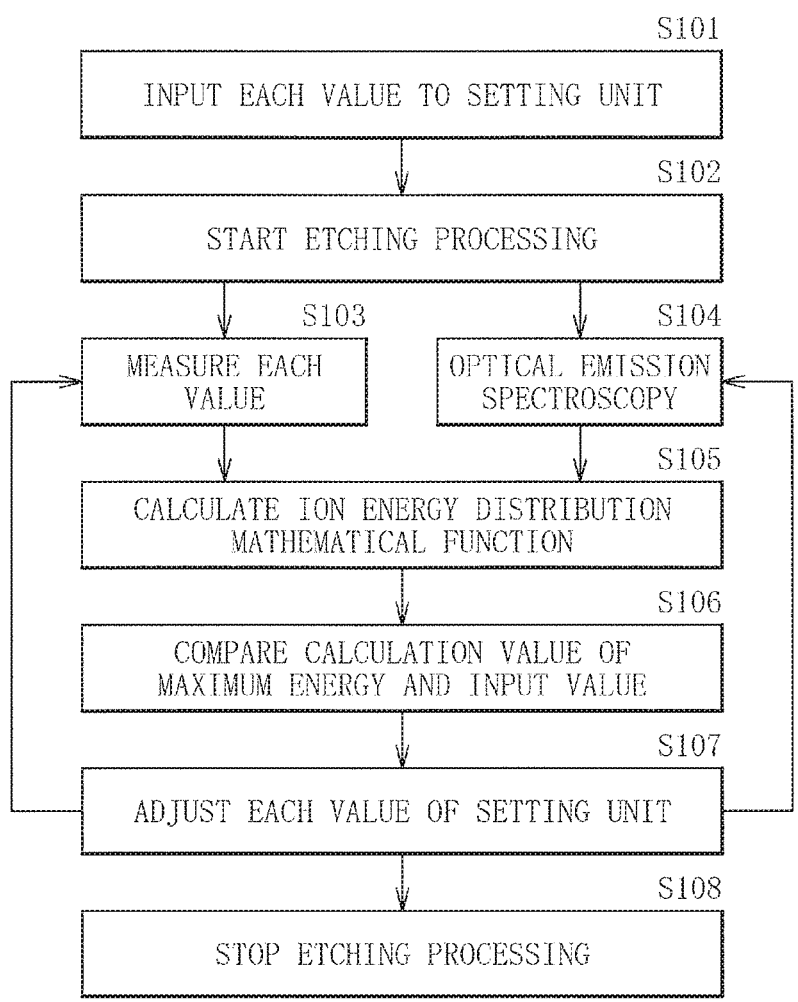

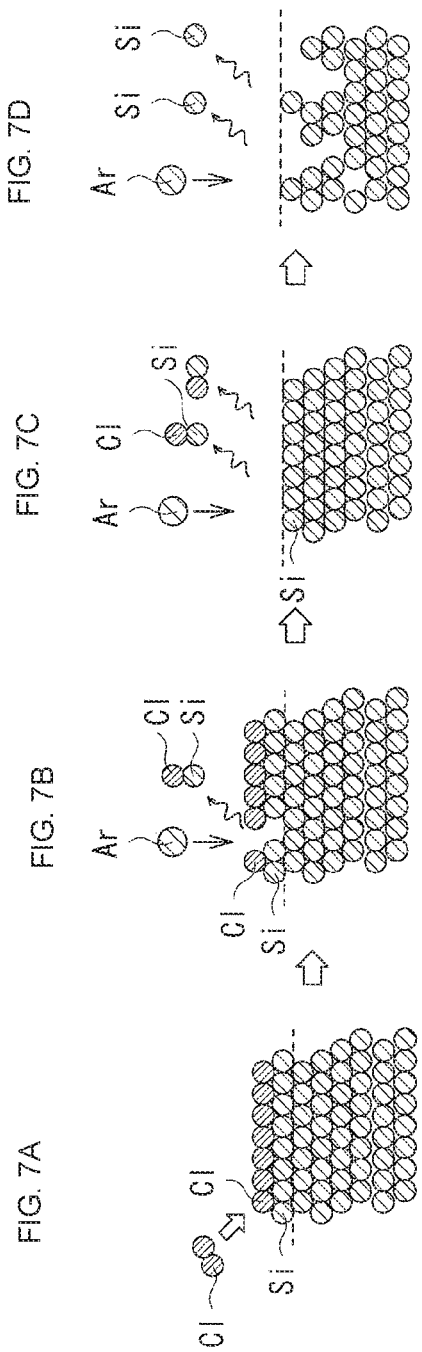

[FIG. 8]
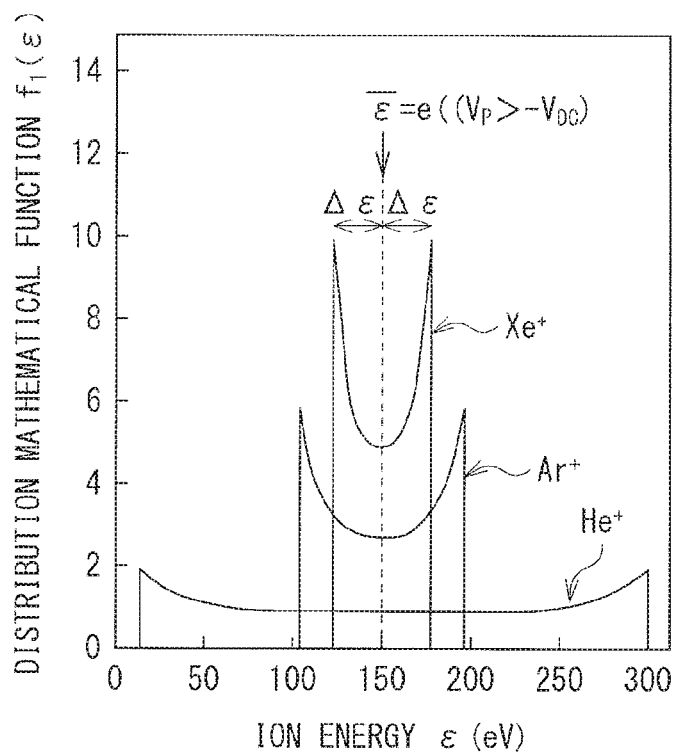

[FIG. 9]
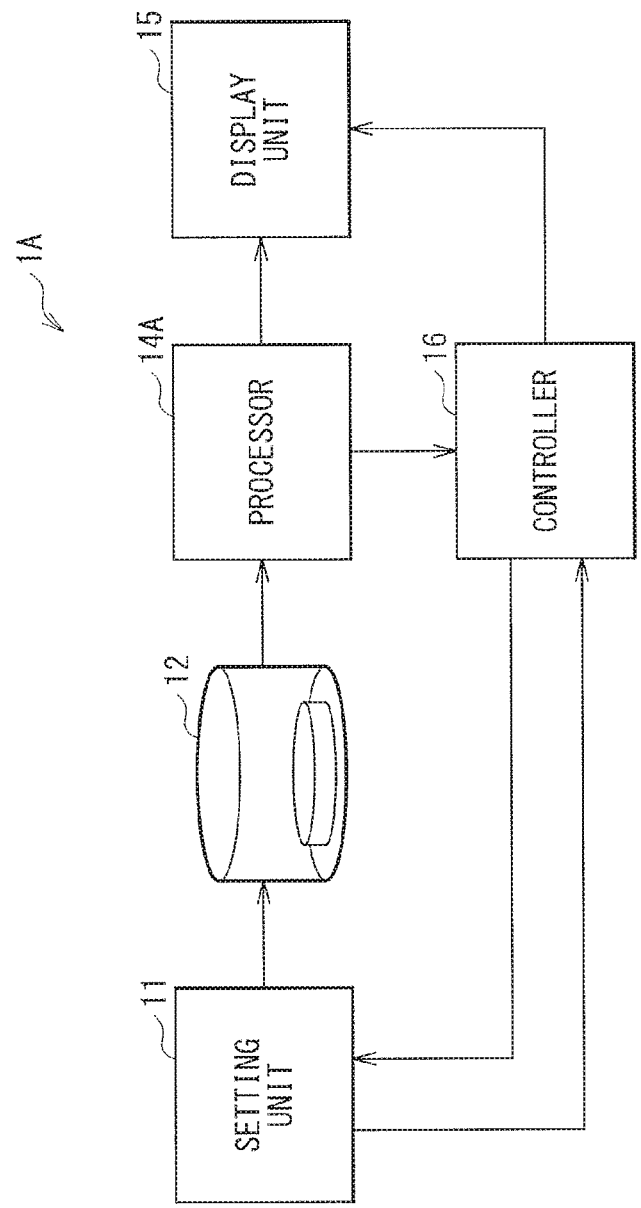

[FIG. 10]
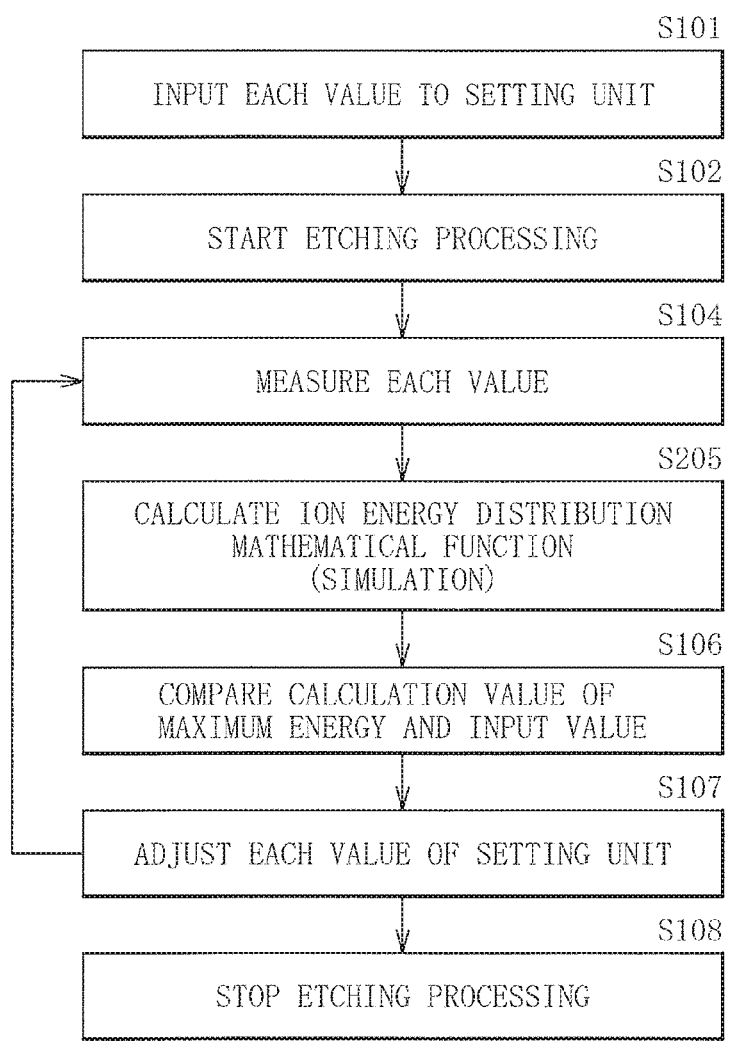

ETCHING METHOD AND ETCHING PROCESSING APPARATUS

CROSS REFERENCE TO RELATED APPLICATIONS

This application is a U.S. National Phase of International Patent Application No. PCT/JP2018/025193 filed on Jul. 3, 2018, which claims priority benefit of Japanese Patent Application No. JP 2017-157758 filed in the Japan Patent Office on Aug. 18, 2017. Each of the above-referenced applications is hereby incorporated herein by reference in its entirety.

TECHNICAL FIELD

The present technology relates to an etching method and an etching processing apparatus, for example, suitable for atomic layer etching (ALE: Atomic Layer Etching).

BACKGROUND ART

As semiconductor devices have been miniaturized, for example, more advance techniques such as an atomic layer etching technique are necessary (for example, refer to PTL 1).

For example, atomic layer etching on a silicon (Si) wafer is performed as follows. First, halogen-based gas such as chlorine (Cl) is attracted to a wafer surface. Next, after extra gas is vacuumed, the surface is applied with argon (Ar) ions. With this operation, a single layer of Si of the wafer surface is removed in a form of a reaction product (SiCl).

CITATION LIST

Patent Literature

PTL 1: Japanese Unexamined Patent Application Publication (Translation of PCT Application) No. 2002-527887

SUMMARY OF THE INVENTION

Regarding an etching method such as the atomic layer etching, it is desired to control an etching depth and a damage on a wafer with high accuracy. Here, the "etching depth" refers to a depth of a removed film, and the "damage" refers to degradation of the film caused by ion penetration and the like.

Therefore, it is desirable to provide an etching method and an etching processing apparatus that make it possible to control an etching depth and a damage on a wafer with high accuracy.

An etching method according to an embodiment of the present technology includes: inputting, to a setting unit, at least electric power, a pressure, and a gas flow rate; performing etching processing in a chamber, on the basis of a value inputted to the setting unit; and calculating an ion energy distribution mathematical function, by using a measured value upon the etching processing.

In the etching method according to an embodiment of the present technology, since the ion energy distribution mathematical function is calculated at the time of the etching processing, for example, a maximum energy value of the ion energy distribution mathematical function is extracted.

An etching processing apparatus according to an embodiment of the present technology includes: a setting unit to which at least electric power, a pressure, and a gas flow rate are inputted; a chamber in which etching processing is performed on the basis of a value inputted to the setting unit; and a processor that calculates an ion energy distribution mathematical function, by using a measured value upon the etching processing.

In the etching processing apparatus according to an embodiment of the present technology, since the processor that calculates the ion energy distribution mathematical function at the time of the etching processing is provided, for example, a maximum energy value of the ion energy distribution mathematical function is extracted.

According to the etching method and the etching processing apparatus according to an embodiment of the present technology, since the ion energy distribution mathematical function is calculated at the time of the etching processing, it is possible to adjust an etching processing condition in accordance with the extracted maximum energy value of the ion energy distribution mathematical function. Therefore, it is possible to control an etching depth and a damage on a wafer with high accuracy.

Note that the above content is an example of the present disclosure. An effect of the present disclosure is not limited to the effects described above, and may be other different effect or may further include other effects.

BRIEF DESCRIPTION OF DRAWING

FIG. 1 is a block diagram illustrating a configuration of a main portion of an etching processing apparatus according to an embodiment of the present technology.

FIG. 2 is a diagram illustrating an example of an analysis result of an analyzer illustrated in FIG. 1.

FIG. 3A is a diagram illustrating an example of an electron temperature distribution displayed on a display unit illustrated in FIG. 1.

FIG. 3B is a diagram illustrating another example of the electron temperature distribution displayed on the display unit illustrated in FIG. 1.

FIG. 4 is a diagram illustrating an example of an ion energy distribution displayed on the display unit illustrated in FIG. 1.

FIG. 5A is a diagram illustrating an example of an ion penetration depth distribution displayed on the display unit illustrated in FIG. 1.

FIG. 5B is a diagram of another example of the ion penetration depth distribution displayed on the display unit illustrated in FIG. 1.

FIG. 6 is a flowchart illustrating an operation of the etching processing apparatus illustrated in FIG. 1.

FIGS. 7A, 7B, 7C, and 7D are diagrams for explaining processes of atomic layer etching in order.

FIG. 8 is a diagram illustrating a relationship between a self-bias voltage and ion energy.

FIG. 9 is a block diagram illustrating a configuration of a main portion of an etching processing apparatus according to a modification example.

FIG. 10 is a flowchart illustrating an operation of the etching processing apparatus illustrated in FIG. 9.

MODES FOR CARRYING OUT THE INVENTION

Hereinafter, an embodiment of the present technology will be described in detail with reference to the drawings. Note that the description will be made in the following order.

1. Embodiment

An etching processing apparatus including a processor that calculates an ion energy distribution mathematical function 2. Modification Example An example in which an ion energy distribution mathematical function is calculated by using simulation Embodiment

[Configuration]

FIG. 1 illustrates a configuration of a main portion of an etching processing apparatus (etching processing apparatus 1) according to an embodiment of the present technology. The etching processing apparatus 1 performs, for example, atomic layer etching and includes a setting unit 11, a chamber 12, an analyzer 13, a processor 14, a display unit 15, and a controller 16. In the chamber 12, an upper electrode and a lower electrode opposing each other are provided, and a wafer to be etched is disposed on the lower electrode. When a voltage is applied to the upper electrode and the lower electrode, gas between the electrodes become plasmas, and a wafer surface is etched.

The setting unit 11 sets a processing condition of etching performed in the chamber 12. A so-called process recipe is inputted to the setting unit 11. To the setting unit 11, for example, a normal process recipe such as an amount of electric power of each of the upper electrode and the lower electrode, a pressure in the chamber 12, a flow rate of gas supplied into the chamber 12, a temperature and a processing time in the chamber 12, and the like is inputted. In addition to such a normal process recipe, a maximum energy value $E_{SV}$ of an ion energy mathematical function that makes it possible to perform atomic-level etching is inputted to the setting unit 11. The maximum energy value $E_{SV}$ of the ion energy mathematical function inputted to the setting unit 11 is adjusted in accordance with an etching object, a state in the chamber 12, and the like.

For example, when the etching object is silicon (Si) and oxygen does not exist in the plasma, the maximum energy value $E_{SV}$ of the ion energy mathematical function is set to be equal to or less than 20 eV. Here, no existence of oxygen means not only that oxygen due to gas introduction does not exist but also that no oxygen is emitted from each component in the chamber 12. When the etching object is silicon (Si) and oxygen exists in the plasma, the maximum energy value $E_{SV}$ of the ion energy mathematical function is set to be equal to or more than 20 eV.

For example, when the etching object is silicon oxide ($SiO_2$), the maximum energy value $E_{SV}$ of the ion energy mathematical function is set to be equal to or less than 40 eV. In a case where etching gas includes fluorinated hydrocarbon (CF or CHF), it is preferable to set the maximum energy value $E_{SV}$ of the ion energy mathematical function in consideration of an energy loss caused by a CF film or a CHF film.

In the chamber 12, etching processing is performed in accordance with the condition inputted to the setting unit 11. The etching object is, for example, silicon (Si), silicon oxide ($SiO_2$), or the like. In the chamber 12, for example, a heater that controls a temperature of a wall in the chamber 12 and a temperature of a mechanism (electrostatic chuck) that attracts the wafer to a stage is provided. The chamber 12 has a supply port and an exhaust port of gas, and for example, halogen-based etching gas including fluorine (F), chlorine (Cl), or the like is supplied into the chamber 12.

It is preferable that the gas to be supplied into the chamber 12 include two or more kinds of rare gas. This rare gas may be included in the process recipe, or the rare gas may be added separately from the process recipe. When the rare gas is to be added separately from the process recipe, for example, a percentage of the rare gas is set to be equal to or less than 5%. The two or more kinds of rare gas is selected, for example, from among helium (He), neon (Ne), argon (Ar), xenon (Xe), and krypton (Kr). By supplying the two or more kinds of rare gas into the chamber 12, as described later, it is possible to more accurately calculate an electron temperature distribution (EEDF: Electron Energy Distribution Function) of a plasma from a light emission intensity ratio between the two or more kinds of rare gas.

The analyzer 13 performs optical emission spectroscopy (OES: Optical Emission Spectroscopy) in the chamber 12. It is preferable that a resolution of the optical emission spectroscopy be equal to or less than 0.1 nm. An analysis result of the optical emission spectroscopy is used at the time when the processor 14 calculates an ion energy distribution mathematical function.

FIG. 2 is a diagram illustrating an example of a result of the optical emission spectroscopy by the analyzer 13. The analyzer 13 measures, for example, light emission intensities of respective two or more pieces of light having different wavelengths and a light emission intensity of each of the two or more kinds of rare gas supplied into the chamber 12.

The processor 14 calculates the ion energy distribution mathematical function on the basis of the state in the chamber 12. Specifically, for example, the ion energy distribution mathematical function is calculated from the amount of electric power of each of the upper electrode and the lower electrode, the pressure in the chamber 12, the flow rate of gas supplied into the chamber 12, a measured value (actual measured value) of the temperature in the chamber 12, and an analysis value of the analyzer 13 by using the Monte Carlo simulation. Since the processor 14 that calculates the ion energy distribution mathematical function is provided in the present embodiment, it is possible to perform feedback based on the maximum energy value (energy value $E_{MAX}$ to be described later) of the ion energy distribution mathematical function. Although the details will be described later, with this operation, it is possible to control an etching depth and a damage on the wafer with high accuracy.

Calculation of an ion energy distribution mathematical function Ac by the Monte Carlo simulation by the processor 14 is performed, for example, in accordance with the following Expressions (1) to (6) (for example, refer to K. Denpoh et al., Jpn. J. Appl. Phys. 43 (2004) 5533 and D. Vender and R. W. Boswell, IEEE Trans. Plasma Sci. 18 (1990) 725).

[Formula 1]

$$\Delta \varepsilon = \frac{2eV_{RF}}{3\omega d} \sqrt{\frac{2\varepsilon}{m_i}} \quad (1)$$

$e$: electron charge [C] $1.6e-19$
$V_{RF}$: RF amplitude [V]
$\omega$: angular frequency [Hz]
$d$: thickness of sheath [m]
$\bar{\varepsilon}$: average acceleration energy [J]
$m_i$: molecule weight [Kg]

-continued

[Formula 2]

$$V_{RF} = 2 \times \overline{V_{p1}} + |V_{dc}| \quad (2)$$

$V_{p1}$: plasma potential [V]
$P_{dc}$: self-bias voltage [V]

[Formula 3]

$$\omega = f \times 2 \times 3.1415 \quad (3)$$

$f$: substrate bias frequency [Hz]

[Formula 4]

$$d = 0.585 \times \lambda \times \left(\frac{2 \times \varepsilon}{T_e}\right)^{\frac{3}{4}} \quad (4)$$

$\lambda$: device length [m]
$T_e$: electron temperature [eV]

[Formula 5]

$$\bar{\varepsilon} = \overline{V_{p1}} + |V_{dc}| \quad (5)$$

[Formula 6]

$$\lambda = 7430 \times \sqrt{\frac{T_e}{N_e}} \quad (6)$$

$N_e$: electron density [/cm³]

For example, a peak-to-peak voltage Vpp in the chamber 12 may be measured and an RF amplitude $V_{RF}$ in Expressions (1) and (2) may be obtained by using the following Expression (7) from a measured value of the peak-to-peak voltage Vpp. Further, a calibration curve of the peak-to-peak voltage Vpp and a self-bias voltage Vdc (Vdc=α×Vpp+β, α and β are constants) is created in advance and the self-bias voltage Vdc obtained from the measured value of the peak-to-peak voltage Vpp by using the calibration curve may be used for Expressions (2) and (5).

[Formula 7]

$$V_{RF}=V_{pp}/2 \quad (7)$$

$V_{pp}$: peak-to-peak voltage [V]

Alternatively, the self-bias voltage Vdc in the chamber 12 may be measured, and the measured value of the self-bias voltage Vdc may be used for Expressions (2) and (5). Similarly to the above, the calibration curve of the peak-to-peak voltage Vpp and the self-bias voltage Vdc (Vdc=α× Vpp+β, α and β are constants) may be created in advance and the peak-to-peak voltage Vpp may be calculated from the measured value of the self-bias voltage Vdc by using the calibration curve. The RF amplitude $V_{RF}$ in Expressions (1) and (2) is obtained from the calculated value of the peak-to-peak voltage Vpp and Expression (7).

A plasma potential Vpl in Expressions (2) and (5), an electron temperature Te in Expressions (4) and (6), and an electron density Ne in Expression (6) are calculated, for example, from the analysis result of the optical emission spectroscopy by the analyzer 13.

For example, it is possible to calculate the electron temperature Te by using a light emission intensity ratio between two or more pieces of light having different wavelengths (for example, refer to H. Akatsuka et al., Proc. Of 2015 International Symposium on Dry Process, P95).

Instead of the electron temperature Te, the electron temperature distribution may be used. The electron temperature distribution is calculated from the light emission intensity ratio between the two or more kinds of rare gas supplied into the chamber 12, on the basis of the Maxwell distribution or the Bi-Maxwell distribution.

FIG. 3A illustrates an example of the electron temperature distribution calculated on the basis of the Maxwell distribution, and FIG. 3B illustrates an example of the electron temperature distribution calculated on the basis of the Bi-Maxwell distribution. Such an electron temperature distribution calculated on the basis of the Maxwell distribution or the Bi-Maxwell distribution is used for calculation of the ion energy distribution mathematical function and, for example, displayed on the display unit 15. The display unit 15 includes, for example, a display.

It is possible to calculate the electron density Ne by using the light emission intensity ratio between the two or more pieces of light having different wavelengths (for example, H. Akatsuka et al., Proc. Of 2015 International Symposium on Dry Process, P95).

It is possible to obtain the plasma potential Vpl by using the following Expression (8). In Expression (8), a value of a coefficient k changes depending on the kind of the ion, for example, in a range of about three to about seven. For example, when an argon (Ar) ion is used, the coefficient k is about five, and when hydrogen (H) is used, the coefficient k is about 3.3.

[Formula 8]

$$V_{pl} \doteqdot k \times Te \quad (8)$$

k: coefficient

For example, in a case where the CF film or the CHF film is to be generated in the chamber 12, it is preferable to measure a thickness of each of such films by using a method such as the ellipsometry. An energy loss caused by these films is considered by the processor 14.

FIG. 4 illustrates an example of the ion energy distribution mathematical function calculated by the processor 14. In this figure, the horizontal axis indicates energy, and the vertical axis indicates the number of ions. Such an energy distribution mathematical function is displayed on the display unit 15 in real time. The processor 14 extracts the maximum energy value $E_{MAX}$ from the calculated ion energy distribution mathematical function and displays the maximum energy value $E_{MAX}$ on the display unit 15, and transmits information regarding the maximum energy value $E_{MAX}$ to the controller 16. There are many cases where the maximum energy value $E_{MAX}$ overlaps with a position of a peak as illustrated in FIG. 4. However, even in a case where the peak is not detected, it is sufficient that a position where the energy is the highest (for example, a right end of the horizontal axis in FIG. 4) is extracted. A case where the peak is not detected is, for example, a case where a pressure is high.

The processor 14 may calculate the entire area (integral value) of the ion energy distribution mathematical function and transmit the calculated value to the controller 16 together with the maximum energy value $E_{MAX}$. The electron density Ne may be predicted from the entire area of the ion energy distribution mathematical function.

The electron density Ne, a molecule weight mi, the RF amplitude $V_{RF}$, and the like may be displayed on the display unit 15. The etching depth and the depth of the damage of the object may be made confirmable on the display unit 15 on the basis of the result calculated by the processor 14. For example, the display unit 15 displays a distribution of an ion (a damage) penetration depth, a projected range (a peak depth of a damage), and the deepest distance of the ion.

FIGS. 5A and 5B are conceptual diagrams of the ion penetration depth distribution displayed on the display unit 15. For example, it is possible to confirm the etching depth of the object on the display unit 15 in this way by inputting the kind of the etching object to the setting unit 11 in advance.

The controller 16 compares the maximum energy value $E_{MAX}$ extracted by the processor 14 with the maximum energy value $E_{SV}$ inputted to the setting unit 11. A difference between the energy value $E_{MAX}$ and the energy value $E_{SV}$ may be displayed on the display unit 15. The controller 16 sends a signal to the setting unit 11 to allow the maximum energy value $E_{MAX}$ that is calculated on the basis of the state in the chamber 12 to be closer to the maximum energy value $E_{SV}$ inputted to the setting unit 11. Specifically, bias power (Bias Power) with which the energy value $E_{MAX}$ is within a range of ±10% of the energy value $E_{SV}$ is calculated, and the amount of electric power of the upper electrode and the amount of electric power of the lower electrode to achieve this bias power are sent to the setting unit 11. The setting unit 11 may change either one of the amounts of electric power of the upper electrode or the lower electrode or may change both amounts of electric power. In a case where the energy value $E_{MAX}$ is within the range of ±10% of the energy value $E_{SV}$, each value of the setting unit 11 is maintained.

The entire area (integral value) of the ion energy distribution mathematical function may be inputted to the setting unit 11 in advance and the entire area of the ion energy distribution mathematical function calculated by the processor 14 may be brought closer to the setting value. The controller 16 calculates source power (Source Power) to achieve this operation and sends the source power to the setting unit 11. The entire area of the ion energy distribution mathematical function is proportional to a current density (mA/cm$^2$) of an ion applied on the wafer, an ion flux (the number of ions/cm$^2$/s), and the electron density Ne in the plasma. Therefore, instead of the entire area of the ion energy distribution mathematical function, the current density (mA/cm$^2$), the ion flux (the number of ions/cm$^2$/s), and the electron density Ne may be inputted.

[Operation]

FIG. 6 illustrates a flow of etching processing by such an etching processing apparatus 1.

First, a general process recipe and the maximum energy value $E_{SV}$ of the ion energy mathematical function are inputted to the setting unit 11 (step S101). Next, under the condition inputted to the setting unit 11, the etching processing is started in the chamber 12 (step S102). In a case where etching gas includes fluorinated hydrocarbon (CF or CHF), it is preferable to perform plasma cleaning in the chamber 12 by using gas including at least oxygen for each time when a single wafer is processed.

After starting the etching processing, each value in the chamber 12 is measured (step S103). Specifically, the peak-to-peak voltage Vpp and the like are measured. While performing step S103, the analyzer 13 performs the optical emission spectroscopy in the chamber 12 (step S104).

The measured value such as the peak-to-peak voltage Vpp and the analysis value of the analyzer 13 are sent to the processor 14 and the processor 14 calculates the ion energy distribution mathematical function (step S105). The processor 14 extracts the maximum energy value $E_{MAX}$ from the ion energy distribution mathematical function. The ion energy distribution mathematical function and the maximum energy value $E_{MAX}$ are displayed on the display unit 15.

After the maximum energy value $E_{MAX}$ is extracted, the controller 16 compares the energy value $E_{SV}$ inputted to the setting unit 11 with the energy value $E_{MAX}$ (step S106), and detects a difference between the compared values. The difference is displayed on the display unit 15. The controller 16 performs feedback to decrease the difference. For example, the controller 16 calculates the bias power (Bias Power) to allow the energy value $E_{MAX}$ to be closer to the energy value $E_{SV}$ and sends the information to the setting unit 11. The setting unit 11 adjusts, for example, the amounts of electric power of the upper electrode and the lower electrode and the like on the basis of the information from the controller 16 (step S107). After adjusting each value by the setting unit 11, the measurement to detect the state in the chamber 12 is performed again (steps S103 and S104), and the calculation of the ion energy distribution mathematical function (step S105), the comparison between the energy value $E_{MAX}$ and the energy value $E_{SV}$ (step S106), and the feedback to the setting unit 11 (step S107) are repeated until the etching processing is stopped (step S108).

[Workings and Effect]

Since the processor 14 calculates the ion energy distribution mathematical function when the etching processing apparatus 1 according to the present embodiment performs the etching processing in the chamber 12, the maximum energy value $E_{MAX}$ of the ion energy distribution mathematical function is extracted. With this operation, it is possible for the etching processing apparatus 1 to control the etching depth and the damage on the wafer with high accuracy. This will be described below.

FIGS. 7A, 7B, 7C, and 7D illustrate each of processes of the atomic layer etching. For example, after halogen-based gas such as chlorine (Cl) or the like is attracted to a silicon (Si) wafer surface (FIG. 7A), the silicon wafer surface is applied with argon (Ar) ions (FIG. 7B). With this operation, a single atomic layer is removed in a form of a reaction product (SiCl) (FIG. 7C). However, in a case where the ion energy is not adjusted, there is a possibility that the removal of the silicon layer is not stopped by a single layer and a base silicon layer is removed as well (FIG. 7D).

A method of predicting the etching depth and the damage on the wafer only by other parameters without calculating the ion energy may be considered. For example, a method is considered in which the self-bias voltage Vdc is obtained from the peak-to-peak voltage Vpp by using the calibration curve and the self-bias voltage Vdc is controlled.

However, as illustrated in FIG. 8, the ion has high energy equal to or higher than a voltage (a voltage of the center) determined by the self-bias voltage Vdc. Therefore, it is not possible to control the ion energy even if the self-bias voltage Vdc is controlled. That is, it is not possible to control the etching depth and the damage on the wafer.

In contrast, in the present embodiment, the processor 14 calculates the ion energy distribution mathematical function that is based on the state of the chamber 12 and extracts the maximum energy value $E_{MAX}$. With this operation, it is possible to adjust the etching processing condition (each value of the setting unit 11) to allow the energy value $E_{MAX}$ to be closer to a desired energy value $E_{SV}$ inputted to the setting unit 11. Therefore, it is possible to perform atomic-level etching without causing a removal of the base layer.

As described above, since the processor 14 calculates the ion energy distribution mathematical function in the present embodiment, it is possible to adjust the etching processing condition in accordance with the extracted maximum energy value $E_{MAX}$ of the ion energy distribution mathematical function. Therefore, it is possible to control the etching depth and the damage on the wafer with high accuracy.

Furthermore, since the calculated ion energy distribution mathematical function is displayed on the display unit 15 in real time, it is possible to easily monitor an etching situation.

Hereinafter, a modification example of the embodiment will be described. In the following description, a component same as that in the embodiment is denoted with the same reference numeral, and description thereof will be appropriately omitted.

Modification Example

FIG. 9 illustrates a configuration of a main portion of an etching processing apparatus (etching processing apparatus 1A) according to a modification example of the embodiment. In the etching processing apparatus 1A, an analyzer (the analyzer 13 in FIG. 1) is not provided. A processor (processor 14A) of the etching processing apparatus 1A performs more advanced calculation processing than the processor 14 of the etching processing apparatus 1. Except for this point, the etching processing apparatus 1A and the etching processing apparatus 1 have the similar configuration and have the similar workings and effect.

FIG. 10 illustrates an operation of the etching processing apparatus 1A. The etching processing apparatus 1A calculates an ion energy distribution mathematical function from the measured value in the chamber 12 such as the peak-to-peak voltage Vpp (step S103) and from a value calculated by simulation by the processor 14A. That is, parameters necessary for calculating the energy distribution mathematical function are calculated by using the simulation by the processor 14A.

In this way, the ion energy distribution mathematical function may be calculated by using the simulation instead of the optical emission spectroscopy.

The present technology has been described using the embodiment above. However, the present technology is not limited to the embodiment, and it is possible to variously modify the present technology. For example, the components of the etching processing apparatuses 1 and 1A exemplified in the embodiment and the like are only exemplary, and other components may be further included.

Furthermore, in the embodiment and the like, a case where the etching processing apparatuses 1 and 1A perform the atomic layer etching is described as an example. However, it is possible to apply the present technology to other dry etching techniques.

Note that the effects described herein are only exemplary and not limited to this, and other effect may be obtained.

Note that it is possible for the present technology to have the following configurations.

(1)

An etching method including:

inputting, to a setting unit, at least electric power, a pressure, and a gas flow rate;

performing etching processing in a chamber, on the basis of a value inputted to the setting unit; and calculating an ion energy distribution mathematical function, by using a measured value upon the etching processing.

(2)

The etching method according to (1), further including adjusting a value of the setting unit to allow a maximum energy value of the calculated ion energy distribution mathematical function to be closer to a maximum energy value of an ion energy distribution mathematical function that is inputted in advance.

(3)

The etching method according to (1) or (2), in which the measured value includes a peak-to-peak voltage Vpp or a self-bias voltage Vdc.

(4)

The etching method according to (3), in which the measured value includes an electron temperature Te or an electron temperature distribution EEDF, and an electron density Ne.

(5)

The etching method according to (4), in which the electron temperature Te or the electron temperature distribution EEDF, and the electron density Ne are measured by performing optical emission spectroscopy upon the etching processing.

(6)

The etching method according to (4) or (5), in which rare gas is added into the chamber, and the electron temperature distribution EEDF is obtained by using a Maxwell distribution or a Bi-Maxwell distribution.

(7)

The etching method according to (3), in which the ion energy distribution mathematical function is calculated from the measured value and from a calculated value obtained by simulation.

(8)

The etching method according to any one of (1) to (7), in which the calculated ion energy distribution mathematical function is displayed in real time.

(9)

The etching method according to any one of (1) to (8), further including displaying a distribution of an ion penetration depth to an etching object, obtained from the ion energy distribution mathematical function.

(10)

The etching method according to any one of (1) to (9), in which the etching processing includes atomic layer etching.

(11)

An etching processing apparatus including:

a setting unit to which at least electric power, a pressure, and a gas flow rate are inputted;

a chamber in which etching processing is performed on the basis of a value inputted to the setting unit; and a processor that calculates an ion energy distribution mathematical function, by using a measured value upon the etching processing.

(12)

The etching processing apparatus according to (11), further including a controller, in which the controller adjusts a value of the setting unit to allow a maximum energy value of the calculated ion energy distribution mathematical function to be closer to a maximum energy value of an ion energy distribution mathematical function that is inputted in advance.

(13)

The etching processing apparatus according to (11) or (12), further including an analyzer that performs optical emission spectroscopy upon the etching processing, in which an analysis value analyzed by the analyzer is inputted to the processor together with the measured value.

(14)

The etching processing apparatus according to any one of (11) to (13), further including a display that displays the calculated ion energy distribution mathematical function in real time.

The present application claims priority based on Japanese Patent Application No. 2017-157758 filed with the Japan Patent Office on Aug. 18, 2017, the entire contents of which are incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. An etching method, comprising:
   inputting, to a setting unit, a first value of each of an electric power, a pressure, and a gas flow rate;
   inputting, to the setting unit, a first energy value of an ion energy mathematical function;
   performing etching processing in a chamber based on the inputted first value;
   measuring a second value based on the etching processing;
   calculating an ion energy distribution mathematical function based on the measured second value;
   extracting a second energy value from the calculated ion energy distribution mathematical function;
   detecting a difference between the extracted second energy value and the inputted first energy value; and
   adjusting the inputted first value to decrease the difference between the extracted second energy value and the inputted first energy value.

2. The etching method according to claim 1, further comprising
   displaying the calculated ion energy distribution mathematical function.

3. The etching method according to claim 1, further comprising:
   acquiring, based on the ion energy distribution mathematical function, a distribution of an ion penetration depth to an etching object; and
   displaying the acquired distribution of the ion penetration depth.

4. The etching method according to claim 1, wherein the etching processing comprises atomic layer etching.

5. The etching method according to claim 1, wherein the measured second value includes one of a peak-to-peak voltage Vpp or a self-bias voltage Vdc.

6. The etching method according to claim 5, further comprising:
   calculating a third value by simulation; and
   calculating the ion energy distribution mathematical function based on the measured second value and the calculated third value.

7. The etching method according to claim 5, wherein the measured second value further includes one of an electron temperature Te or an electron temperature distribution EEDF, and an electron density Ne.

8. The etching method according to claim 7, further comprising
   measuring one of the electron temperature Te or the electron temperature distribution EEDF, and the electron density Ne by performing optical emission spectroscopy upon the etching processing.

9. The etching method according to claim 7, further comprising:
   adding a rare gas into the chamber; and
   acquiring the electron temperature distribution EEDF based on one of a Maxwell distribution or a Bi-Maxwell distribution.

10. An etching processing apparatus, comprising:
    a setting unit configured to:
      receive a first value of each of an electric power, a pressure, and a gas flow rate; and
      receive a first energy value of an ion energy mathematical function;
    a chamber configured to perform etching processing based on the received first value;
    a processor configured to:
      measure a second value based on the etching processing;
      calculate an ion energy distribution mathematical function based on the measured second value; and
      extract a second energy value from the calculated ion energy distribution mathematical function; and
    a controller configured to:
      detect a difference between the extracted second energy value and the received first energy value; and
      adjust the received first value to decrease the difference between the extracted second energy value and the received first energy value.

11. The etching processing apparatus according to claim 10, further comprising an analyzer configured to:
    execute optical emission spectroscopy based on the etching processing; and
    analyze an analysis value corresponding to a result of the executed optical emission spectroscopy, wherein the processor is further configured to receive the measured second value together with the analysis value analyzed by the analyzer.

12. The etching processing apparatus according to claim 10, further comprising a display configured to display the calculated ion energy distribution mathematical function in real time.

* * * * *